United States Patent
Lvovsky et al.

(10) Patent No.: US 7,439,836 B2
(45) Date of Patent: Oct. 21, 2008

(54) MAGNETIC FIELD GENERATING APPARATUS FOR MAGNETIC RESONANCE IMAGING

(75) Inventors: Yuri Lvovsky, Florence, SC (US);
Michael Ben Sellers, Florence, SC (US);
Timothy J. Havens, Florence, SC (US)

(73) Assignee: General Electric Company, Schenectady, NY (US)

( * ) Notice: Subject to any disclaimer, the term of this patent is extended or adjusted under 35 U.S.C. 154(b) by 481 days.

(21) Appl. No.: 11/321,555

(22) Filed: Dec. 28, 2005

(65) Prior Publication Data
US 2007/0146107 A1    Jun. 28, 2007

(51) Int. Cl.
*H01F 5/00*    (2006.01)
(52) U.S. Cl. .................. 335/299; 335/296; 335/216
(58) Field of Classification Search .............. 335/216, 335/296–299
See application file for complete search history.

(56) References Cited

U.S. PATENT DOCUMENTS

| | | | | |
|---|---|---|---|---|
| 5,400,786 A | * | 3/1995 | Allis | 600/410 |
| 5,635,839 A | * | 6/1997 | Srivastava et al. | 324/320 |
| 5,982,260 A | * | 11/1999 | Byrne | 335/216 |
| 6,100,780 A | * | 8/2000 | Dorri et al. | 335/216 |
| 6,215,383 B1 | | 4/2001 | Laskaris | 335/299 |
| 6,218,923 B1 | | 4/2001 | Laskaris | 335/299 |
| 6,798,095 B2 | * | 9/2004 | Steinmeyer | 310/58 |
| 6,836,119 B2 | * | 12/2004 | DeMeester et al. | 324/320 |

FOREIGN PATENT DOCUMENTS

EP    0715181 B1    11/1995

* cited by examiner

*Primary Examiner*—Lincoln Donovan
*Assistant Examiner*—Bernard Rojas
(74) *Attorney, Agent, or Firm*—Cantor Colburn LLP

(57) ABSTRACT

A Magnetic Resonance Imaging (MRI) system is disclosed. The MRI system includes a cryogenic magnet assembly with a cryogenic vessel housing a superconducting magnet. Disposed radially inboard of the cryogenic magnet assembly are a gradient coil module and a plurality of room temperature steel rings proximate to the gradient coil module. A field of view is defined by at least the superconducting magnet, the gradient coil module, and the plurality of room temperature steel rings. In response to the superconducting magnet being energized, the room temperature steel rings create high order harmonics that serve to expand the magnetic field homogeneity FOV, and low order harmonics that tend to degrade the magnetic field homogeneity within the FOV. The low order harmonics are compensated for by the cryogenic magnet assembly.

21 Claims, 6 Drawing Sheets

MAGNETIC FIELD GENERATING APPARATUS FOR MAGNETIC RESONANCE IMAGING

BACKGROUND OF THE INVENTION

The present disclosure relates generally to magnetic resonance imaging, and particularly to a magnetic field generating apparatus for magnetic resonance imaging.

High field MRI magnets typically use sets of superconducting coils placed within a liquid helium vessel, which is typically referred to as a 4K (4-degree Kelvin) envelope. The coils produce a homogeneous magnetic field within a required field of view (FOV) by balancing harmonics generated by each coil. The balance is achieved by the appropriate selection of coil ampere-turns, strategic placements, and aspect ratios. The limit of the achievable level of homogeneity (that is, maximum size of FOV) is dictated by the allowable coil envelope and accepted design criteria, such as conductor volume, peak field $B_{peak}$, mechanical stresses, and other criteria which correlate with the cost and robustness of the design. Besides coils, other field generating means, such as magnetized steel rings may be employed in the design, which may help in shaping the homogeneous FOV.

The homogeneity of a magnetic field may be determined by evaluating the coefficients of a Legendre polynomial expansion that describes the magnetic field. Each coefficient represents a different harmonic order, axial harmonics being referred to as Zn, where n is the order of the harmonic, for example n=2 refers to the second order harmonic. The value of each Zn term is an indication of the field homogeneity at a specified spherical volume, with lower absolute values indicating higher field homogeneity. Amplitude of each harmonic created by a magnetized ring, or a coil, depends on the ring (or coil) location and radius; the smaller the radius, the higher the relative contribution of high order harmonics is in the total mix created by the ring (or coil). If field shaping steel rings were disposed within the helium vessel, they would be relatively far from the FOV and therefore generate a mix of harmonics where low orders dominate. However, homogeneity in the axial (z) dimension of the field of view is mostly defined by the high order harmonics, which in a typical whole body MRI imager, often starts with the eighth order and higher.

Demand for a wider-angle MRI with a challenging coil envelope (short length and large bore) to enhance comfort for claustrophobic and bariatric patients comes in conflict with a full-size field of view, especially in the axial (z) direction, which creates a trade-off between the magnet length and the axial field of view (FOVz) dimension. Accordingly, there is a need in the art for an extended axial field of view arrangement that overcomes these drawbacks.

BRIEF DESCRIPTION OF THE INVENTION

An embodiment of the invention includes a Magnetic Resonance Imaging (MRI) system. The MRI system includes a cryogenic magnet assembly with a cryogenic vessel housing a superconducting magnet. Disposed radially inboard of the cryogenic magnet assembly are a gradient coil module and a plurality of room temperature steel rings proximate to the gradient coil module. A field of view is defined by at least the superconducting magnet, the gradient coil module, and the room temperature steel rings. In response to the superconducting magnet being energized, the room temperature steel rings create high order harmonics that serve to expand the magnetic field homogeneity FOV, and low order harmonics that tend to degrade the magnetic field homogeneity within the FOV. The low order harmonics are compensated for by the cryogenic magnet assembly.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides an increased field of view (FOVz) along the axial centerline (also referred to as the z-direction) of an MRI system by using a set of room temperature magnetizable steel rings located close to the FOV within a room temperature radial space within the magnet bore. Such rings are a distinct part of the main magnetic design, distinguished from passive or active shimming elements that are intended to correct for deviations from an ideal condition, which may originate from manufacturing tolerances for example.

In an embodiment, there is a sizable room temperature radial space located within the magnet bore, which is occupied by the gradients and the RF coil. This space includes the radial annulus between the main and the shield gradient coils, which is sometimes used for passive shim rails. Magnetizable steel rings in this room temperature space are closer to the field of view than steel rings disposed within the helium vessel. These room temperature rings are much more effective in creating the proper mix of high order harmonics, including those with order n greater than or equal to six, with a smaller relative contribution of low order harmonics, to allow extension of the axial field of view.

However, these rings do create some undesired, collateral low order harmonics, for example with order n less than six. These low order terms are difficult to compensate for by the rings themselves, as they would require a substantial amount of additional steel and additional ring pairs. While existing MRI magnet designs are considered suitable for their intended purpose, the art of MRI superconducting magnets may be advanced by the use of a combined magnetic design, to utilize room temperature steel rings disposed within the room temperature magnet bore to compensate for high order harmonics while collateral low orders are compensated for by superconducting coils disposed inside the helium vessel which, due to their relatively larger radii, are more effective at creating low-order harmonics, thus allowing an extension of the axial FOV in a short, wide-angle magnet.

Figure 1:
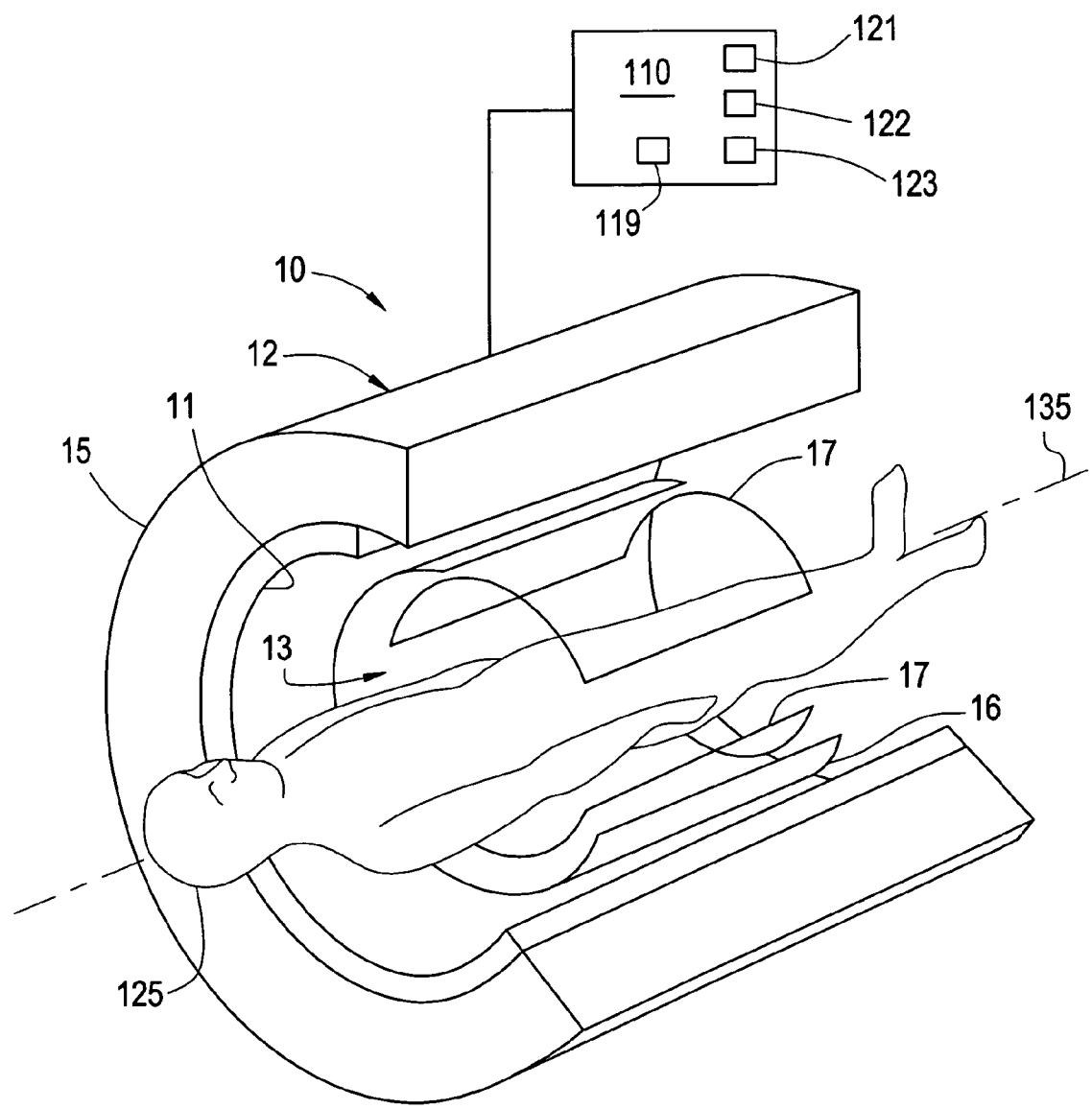
FIG. 1 depicts an exemplary cylindrical MRI system for use in accordance with embodiments of the invention.

FIG. 1 depicts an exemplary embodiment of an MRI system 10 having a magnetic field generating apparatus 12 and a control system 110 for the control and operation thereof. An exemplary apparatus 12, depicted having a portion cutaway to show the structure within the apparatus 12, includes a cryogenic magnet assembly 15, an X-Y-Z gradient coil module 11 disposed radially inboard of the cryogenic magnet assembly 15 for spatial encoding of the magnetic field within an imaging volume inside a patient bore 13, an RF body coil 17 for generating a pulsed RF magnetic $B_1$ field, and a RF shield 16 disposed between the RF coil 17 and the gradient coil module 11 for RF shielding. A person, or other imaging object 125, is placed within the bore 13 of the field generating apparatus 12 and subjected to MRI diagnostics under the control of the control system 110. In an embodiment, the control system 110 includes x, y and z-axis gradient magnetic field power supplies 121 for powering the gradient coil module 11, an RF coil amplifier 119, transmit and receive circuitry 122 for controlling the RF pulses to RF coils 17, and a computer system 123 for overall control and for processing and displaying the nuclear magnetic resonance signals.

Figure 2:
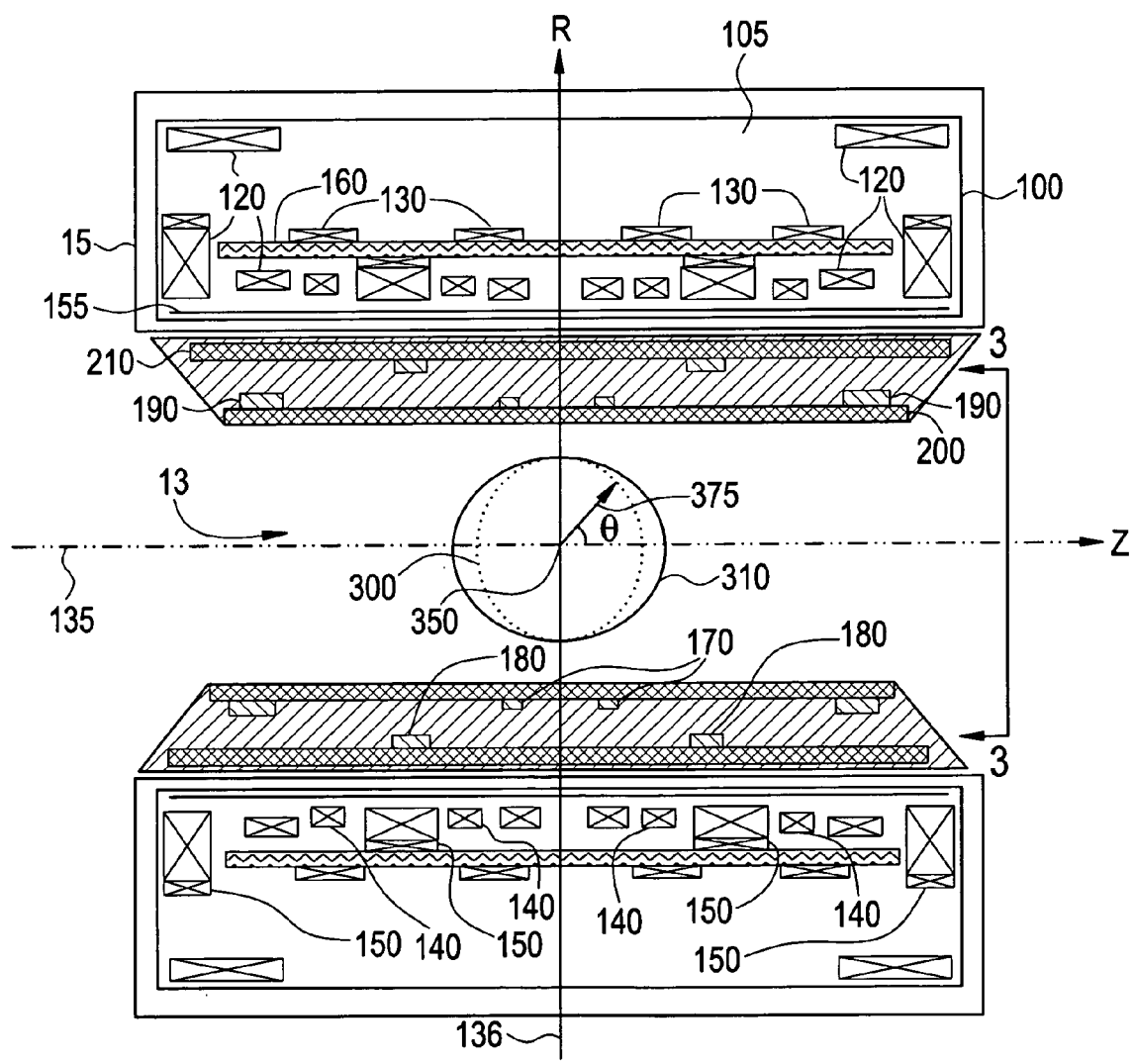
FIG. 2 depicts a partial section view of an exemplary magnetic field generating apparatus in accordance with embodiments of the invention.

Reference is now made to FIG. 2, depicting a partial section view of an exemplary apparatus 12 with the section plane containing a z-axis 135 and a R-axis 136. The apparatus includes the annular cryogenic magnet assembly 15, an annular helium vessel 100, a 4K region 105, a set of main superconducting magnetic coils 120, a main coil mandrel 155, a shim mandrel 160, a set of superconducting shimming coils 130, a set of main mandrel auxiliary superconducting magnetic coils 140, a set of main magnet auxiliary superconducting magnetic coils 150, and a plurality of room temperature steel rings 170, 180, 190. Also depicted is a direction vector 375, an original field of view (also herein referred to as a first field of view or uniformity zone) 300, an extended field of view (also herein referred to as a second field of view or uniformity zone) 310, an isocenter 350, and the patient bore 13.

The z-axis 135 is centered within the gradient coil module 11, which defines the patient bore 13 and the two fields-of-view (FOV) 300 and 310 (which will be discussed further below) centered upon the isocenter 350. It will be appreciated that while the depiction of the fields of view 300, 310 in FIG. 2 are two dimensional, in an embodiment these fields of view 300, 310 define three-dimensional ellipsoids centered upon the isocenter 350. Disposed within the cryogenic magnet assembly 15 is the helium vessel 100, which defines the 4K region 105. Disposed within the 4K region 105 may be the set of main superconducting magnetic coils 120, the auxiliary superconducting magnetic coils 140, 150, the superconducting shimming coils 130, the main coil mandrel 155, and the shim mandrel 160, which will be further described below.

In an embodiment, the annular gradient coil module 11 is disposed radially inboard of the cryogenic magnet assembly 15. A main gradient coil 200 and a shield gradient coil 210 are disposed within the gradient coil module 11. The room temperature steel rings (also herein referred to as rings) 170, 180, 190 are disposed radially inboard of the cryogenic magnet assembly 15, proximate to the gradient coil module 11. The RF coil 16 and the RF shield 17, depicted in FIG. 1, but not depicted in FIG. 2, are disposed between the gradient coil module 11 and the fields of view 300, 310.

The room temperature steel rings 170, 180, 190 are configured and disposed to create a strategic mix of high order harmonics in response to the main superconducting magnetic coils 120 being energized. These high order harmonics are required to compensate for the harmonic terms created by the cryogenic magnet assembly 15 in order to extend its original uniformity zone 300 in z-direction (detail regarding harmonic term compensation is discussed further below). However, these rings 170, 180, 190 also create undesired, collateral low order harmonics (for example, with order n less than six), which degrade the magnetic field homogeneity. These degrading low order terms are difficult to compensate for by the rings 170, 180, 190 themselves, as such compensation would require a substantial amount of additional steel. Furthermore, an attempt to compensate for low order terms with additional steel rings (located radially inboard of the cryogenic magnet assembly 15) would generate additional, unwanted high order harmonics, which in turn would require yet more steel for compensation. It is beneficial to keep the mass of the rings 170, 180, 190 to a minimum because additional steel increases the weight of the cryogenic magnet assembly 15, occupies excessive space within and next to the gradient coils 200, 210 and the RF coils 16, 17, and has a negative impact on the stability of a magnetic field B0, which is related to temperature variation of the magnetization of rings 170, 180, 190. In an embodiment, effects on B0 stability may be managed via temperature control of the steel rings 170, 180, 190. Effective cooling/heating arrangements with a feedback control loop to trace the temperatures of the room temperature steel rings 170, 180, 190 may be utilized. Other means, such as active compensation, may also be employed. Also, magnetic field B0 stability may be enhanced through selection of materials with low saturation field temperature sensitivity.

Figure 3:
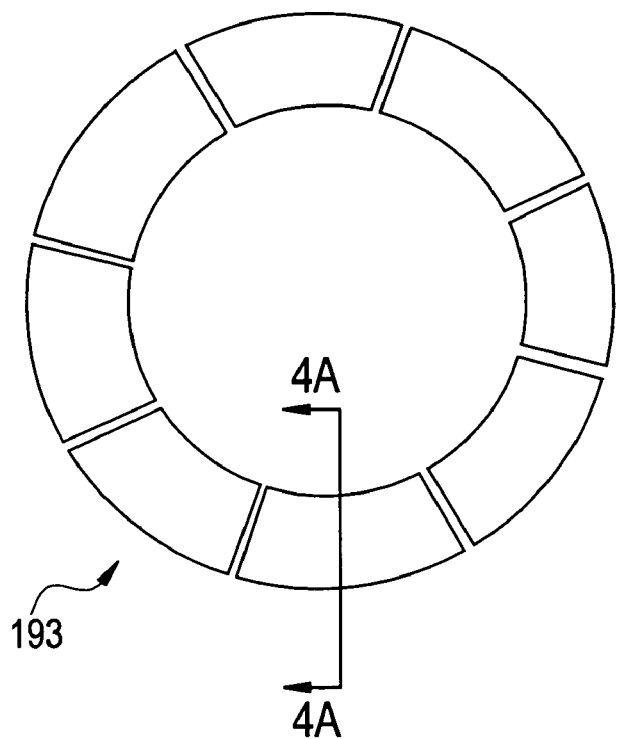
FIG. 3 depicts an end view of an alternate exemplary ring configuration in accordance with embodiments of the invention.
Figure 4A:
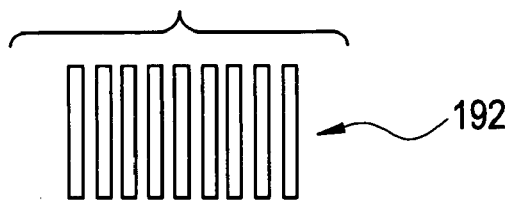
FIG. 4A depicts a section view of an alternate exemplary ring configuration in accordance with embodiments of the invention.
Figure 4B:
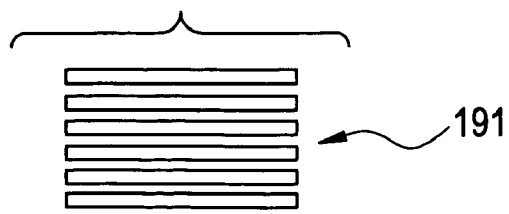
FIG. 4B depicts a section view of an alternate exemplary ring configuration in accordance with embodiments of the invention.

Referring to FIGS. 3, 4A, and 4B, alternate ring constructions to reduce eddy currents are depicted. For example, rings with circumferential segments 193 (see FIG. 3), axial gaps 192 (see FIG. 4A), radial gaps 191 (see FIG. 4B), or laminations thereof may be employed. Note that FIGS. 4A and 4B represent the cross section of two different ring configurations 191, 192 depicted together for convenience, and that FIG. 3 depicts an end view of an embodiment of a room temperature steel ring 190 with circumferential segments 193.

While an embodiment of the invention has been described employing three pairs, or sets, of room temperature steel rings 170, 180, 190 within the gradient coil module 11, it will be appreciated that the scope of the invention is not so limited, and that the invention also applies to other numbers of room temperature steel rings 170, 180, 190 for example one, two, four, or more pairs of rings that may be disposed elsewhere radially inboard of the cryogenic magnet assembly 15, for example between the cryogenic magnet assembly 15 and the gradient coil module 11, between the gradient coil module 11 and the RF coils 16, 17, or between the RF coils 16,17 and patient bore covers (not depicted).

Figure 5:
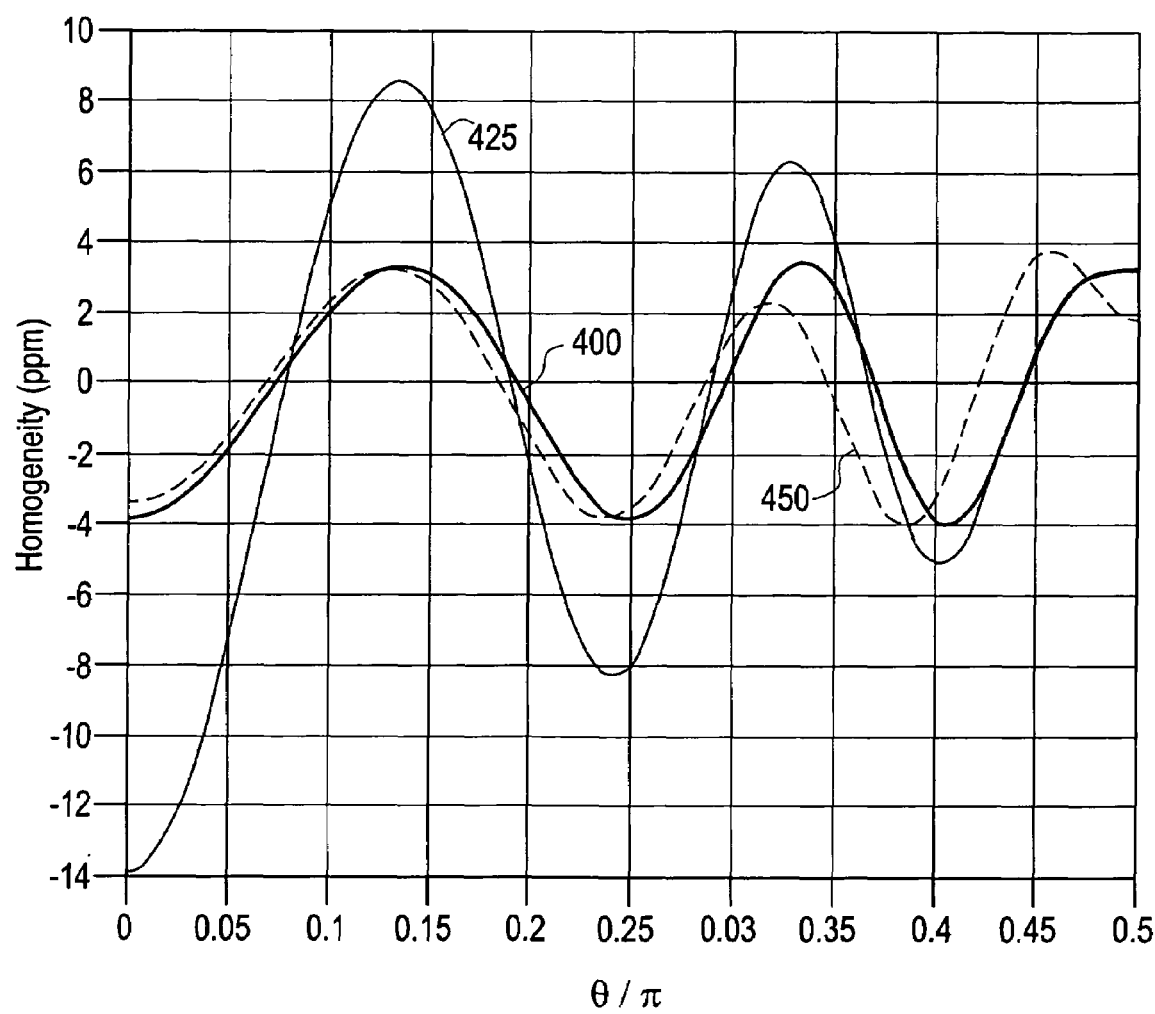
FIG. 5 depicts a graph illustrating exemplary homogeneity values for different fields of view for comparison purposes in accordance with embodiments of the invention.

In an embodiment, FIG. 5 depicts a graph illustrating the homogeneity of the original field of view 300 and the extended field of view 310. The Y-Axis of the graph depicts the magnetic field (B) homogeneity in parts per million (ppm). The X-Axis of the graph depicts the ratio $\theta/\pi$, where $\theta$ is the second of the three coordinates $(r,\theta,\phi)$ within a spherical coordinate system, and is depicted on FIG. 2 to represent the angle between the z-axis and the direction vector 375, which has an origin at the isocenter 350 and a termination on the three dimensional surface of the ellipsoid represented by the field of view 300, 310. It will be appreciated that because of symmetry, $\theta$ is shown only within the angular range of 0 and $\pi/2$. Stated another way, the graphs of FIG. 5 (which will be described further below) represent the homogeneity levels at points on the surface of the fields of view 300, 310 along a path created by the intersection of the section plane, which here is the plane of the paper, containing the z-axis 135 and the R-axis 136, and the fields of view 300, 310 depicted in FIG. 2, as the vector 350 is rotated through various values of θ from 0 to π/2.

Referring briefly back to FIG. 2, an embodiment is depicted with the cryogenic magnet assembly 15 measuring about 130 cm in the z-direction, and the original field of view 300 defined to be 35 cm(z) X 50 cm(R). By employing an embodiment of the invention, the same basic cryogenic magnet assembly 15 has the extended field of view 310 defined as 40 cm(z) X 50 cm(R). Referring now again to FIG. 5, a solid line 400 represents the homogeneity of the original field of view 300 relating to the embodiment of the cryogenic magnet assembly 15 absent the room temperature steel rings 170, 180, 190 disclosed herein. It may be seen that the homogeneity values represented by the line 400 have a maximum value of about +/−3.50 ppm. A solid line 425 represents the homogeneity of the same basic cryogenic magnet assembly 15 without steel rings 170, 180, 190, which would correspond to the field of view 310 of 40 cm(z) X 50 cm(R), that is extended by 5 cm in the z-direction from the original field of view 300. As indicated in FIG. 5, the increase in the original field of view 300 to the extended field of view 310 results in homogeneity values of about +/−11 ppm. In comparison, a dashed line 450 represents the homogeneity values of about +/−3.5 ppm of the same cryogenic magnet assembly 15, with the same extended field of view 310, but in response to applying an embodiment of the invention, which includes the room temperature steel rings 170, 180, 190 to compensate for the high order harmonics generated by the cryogenic magnet assembly 15. As used here, the term "about" represents a minimum amount of variation, resulting from differences within tolerance. Therefore, in the above example of an embodiment, proper application of the room temperature steel rings 170, 180, 190 allows the axial field of view 300 to be extended approximately fourteen percent, without loss of field homogeneity. While an embodiment of the invention has been described wherein beneficial effect is provided to increase the field of view in the axial direction, it will be appreciated that the scope of the invention is not so limited, and that invention also applies to other embodiments, which may derive a beneficial field of view extension in the transverse direction, for example.

TABLE 1

| N | Harmonics Original, ppm | Harmonics to add, ppm |
|---|---|---|
| 0 | 1000000 | 0 |
| 2 | 0.7 | −0.8 |
| 4 | 4.1 | 0.5 |
| 6 | −6.6 | 3.7 |
| 8 | −44.3 | 32.9 |
| 10 | −68.1 | 40.0 |
| 12 | −0.6 | 0 |
| 14 | 14.2 | 0 |
| 16 | −6.3 | 0 |
| 18 | 1.7 | 0 |
| 20 | −0.4 | 0 |
| 22 | 0.1 | 0 |
| 24 | 0 | 0 |

Referring to Table 1, the first 12 even Zn terms (odd terms are zero by symmetric design) of an embodiment of the cryogenic magnet assembly 15 configuration are shown in the Center column. The right hand column depicts the correction harmonics needed to be added to extend the original field of view 300 to the extended field of view 310. The room temperature steel rings 170, 180, 190 are configure to create the high order harmonics having an order greater than or equal to a defined value n0. In the embodiment described by Table 1, n0 is equal to eight. However, it will be appreciated that the scope of the invention is not so limited, and that invention also applies to other embodiments, in which the value of n0 may be equal to six. These needed harmonics, where n0 is equal to eight, may be created by the three sets of room temperature steel rings 170, 180, 190. The greatest benefit of the addition of the room temperature steel rings 170, 180, 190 may be obtained if they are configured to affect two consecutive even harmonics. In the example embodiment illustrated in the graph of FIG. 5, it can be seen that the n=8 and n=10 terms provide the greatest benefit, and that their additive effect is to reduce the absolute value of the Z8 and Z10 terms shown in the center column. These beneficial harmonics allow the original axial field of view 300 to be enlarged to the extended axial field of view 310 with minimal loss of field homogeneity, as discussed and shown above by the graphs in FIG. 5. While an embodiment of the invention has been described wherein beneficial effect is provided by a ring configuration with n0 equal to eight to effect the harmonic terms where n=8 and n=10, it will be appreciated that the scope of the invention is not so limited, and that invention also applies to other embodiments which may derive beneficial effect with a ring configuration where n0 is equal to six, to produce other consecutive even harmonics, such as n=6 and n=8, for example.

As described above, use of the room temperature steel rings 170, 180, 190 configured to compensate for high order harmonics (greater than or equal to the defined value n0) allows extension of the original axial field of view 300, but will create undesired, collateral low order harmonics (less than the defined value n0), which would degrade the magnetic field homogeneity. In the embodiment described above, use of these rings 170, 180, 190 have been seen to create collateral low order harmonics with Z6=−60.0 ppm; Z4=79.6 ppm and Z2=5400 ppm. The above numbers were obtained with an approximate model wherein the magnetic effect from a non-localized cross-section of each ring was represented by a localized magnetic dipole positioned in the ring centroid. Accurate account of the final dimensions of the rings may change the collateral harmonics and the exact location and number of ring pairs, without affecting the validity of the suggested approach. These collateral low order harmonics may be compensated for by a combination of superconducting coils 120, 130, 140, 150 disposed within the cryogenic magnet assembly 15. The result is a combined magnetic design (that is, room temperature steel rings 170, 180, 190 in combination with superconducting coils 120, 130, 140, 150), in which the high order harmonics responsible for extension of the original axial field of view 300 are controlled by the room temperature steel rings 170, 180, 190, configured to have a minimized volume, disposed radially inboard of the cryogenic magnet assembly 15, while the collateral low order harmonics are controlled by a combination of superconducting coils 120, 130, 140, 150 disposed within the cryogenic magnet assembly 15.

In an embodiment, use of the room temperature steel rings 170, 180, 190 may provide additional benefits in addition to the high order harmonic compensation. For example, the room temperature steel rings 170, 180, 190 may be configured with the proper structural integrity to counter the static forces generated by the magnetic field. In an embodiment, epoxy may be used to unitize the room temperature steel rings 170, 180, 190 within the gradient coil module 11. This structural integrity may provide additional support to the gradient coil module 11, thereby reducing acoustic and vibration energy generated by the gradient coil module 11. While an embodiment of the invention has been described employing epoxy to unitize the rings 170, 180, 190 within the gradient coil module, it will be appreciated that the scope of the invention is not so limited, and that the invention also applies to other methods of gradient coil module 11 unitization, such as potting compound, or a fixedly secure gradient coil module 11 structure, for example.

Referring back to FIG. 2, in an embodiment (also herein referred to as version one), the main superconducting magnetic coils (also herein referred to as the superconducting magnet) 120 may be configured to compensate for the degrading low order harmonics generated by the room temperature steel rings 170, 180, 190. This results in a MRI System 10 that is capable of providing the extended axial field of view 310, but requires that the superconducting magnet 120 be of a unique configuration and manufacture, with installation of the gradient coil module 11 including the rings 170, 180, 190. In version one, superconducting compensation coils 130, 140, 150 are not utilized (although shimming coils 130 may be used to compensate manufacturing tolerances, which is not related to the discussed FOV extension). While an embodiment of version one has been described with the superconducting magnet 120 in a configuration depicted in FIG. 2, it will be appreciated that the scope of the invention is not so limited, and that the invention also applies to MRI systems 10 having alternative configurations of the main superconducting magnetic coils 120 not depicted in FIG. 2, for example, a greater or smaller number of coils, or coils in different locations.

In an alternate embodiment (also herein referred to as version two), and with reference still to FIG. 2, the superconducting shimming coils 130, which are separate and independent of the superconducting magnet 120, may be configured to compensate for the collateral low order harmonics created by the rings 170, 180, 190. In this embodiment of version two, the configuration of the superconducting magnet 120 will be the same whether the MRI system 10 provides the original field of view 300 or the extended field of view 310. If an MRI system 10 will be configured to provide the extended field of view 310, the shim mandrel 160, including superconducting shimming coils 130 will be installed within the helium vessel (also herein referred to as the cryogenic vessel) 100. Additionally, the gradient coil module 11 with the room temperature steel rings 170, 180, 190 will be installed within the bore 13 of the cryogenic magnet assembly 15. If the MRI system 10 will be configured to provide the original field of view 300, the gradient coil module 11 without the rings 170, 180, 190 would be used. Whether the original field of view 300 or extended field of view 310 is provided in version two, the auxiliary superconducting magnetic coils 140, 150 are not utilized. While an embodiment of version two has been described employing a set of four superconducting shimming coils 130 in a depicted configuration, it will be appreciated that the scope of the invention is not so limited, and that the invention also applies to MRI systems 10 having alternate numbers or configurations of superconducting shimming coils 130, for example one, two, three, or more coil pairs disposed with or without symmetry to the R-axis 136.

Figure 6:
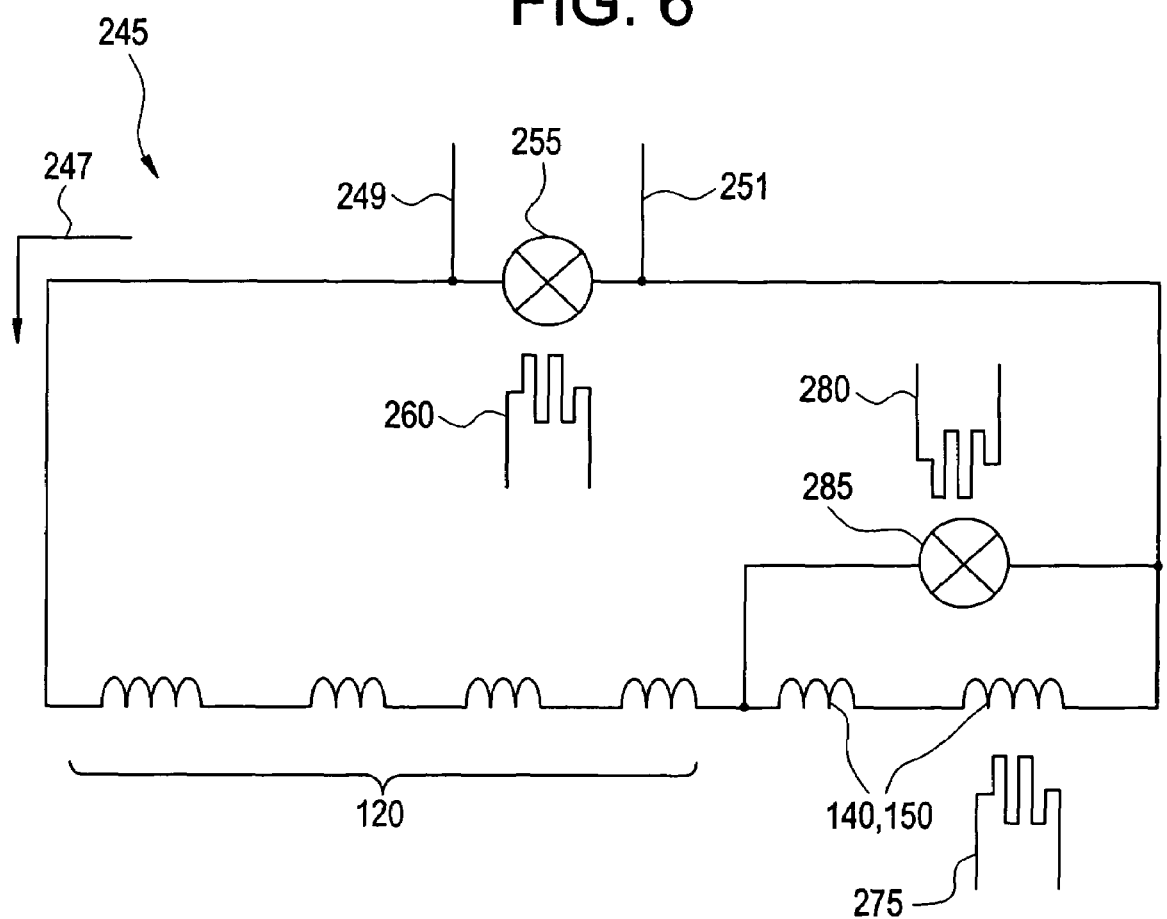
FIG. 6 depicts an exemplary schematic diagram to control a superconducting circuit in accordance with embodiments of the invention.

In an alternate embodiment, (also herein referred to as version three) and with reference still to FIG. 2, the set of auxiliary superconducting magnetic coils 140, 150, which are an extension of the coils of the superconducting magnet 120, will be configured to compensate for the collateral low order harmonics created by the rings 170, 180, 190. In an embodiment, the main mandrel auxiliary superconducting magnetic coils 140 are disposed on the main coil mandrel 155 along with the superconducting magnet 120. The main magnet auxiliary superconducting magnetic coils 150 are disposed on the main magnet superconducting magnetic coils 120. These auxiliary superconducting magnetic coils 140, 150 are in electrical connection with the main superconducting magnetic coils 120, and are controlled by a superconducting magnetic circuit 245, which is depicted in FIG. 6 and described below. In this embodiment of version three (as depicted in FIG. 2 and FIG. 6), the configuration of the superconducting magnet 120 and the auxiliary superconducting magnetic coils 140, 150, will be the same whether the MRI system 10 provides the original field of view 300 or the extended field of view 310. If an MRI system 10 will be configured to provide the extended field of view 310, the gradient coil module 11 with the rings 170, 180, 190 will be installed within the bore 13 of the cryogenic magnet assembly 15, and in operation, current will be directed to flow through the auxiliary superconducting magnetic coils 140, 150. Alternatively, if the MRI system 10 will be configured to provide the original field of view 300, the gradient coil module 11 will not have the rings 170, 180, 190, and current will be diverted around the auxiliary superconducting magnetic coils 140, 150. While an embodiment of version three has been described employing two sets of auxiliary superconducting magnetic coils 140, 150 in depicted locations, it will be appreciated that the scope of the invention is not so limited, and that the invention also applies to MRI systems 10 having alternate numbers or configurations of auxiliary superconducting magnetic coils 140, 150, for example, use of only main mandrel auxiliary superconducting magnetic coils 140, or alternatively, use only of main magnet auxiliary superconducting magnetic coils 150. Similarly, the main magnet auxiliary superconducting magnetic coils 150 may be wound on top of, below, or be any designated subpart of any of the main magnet superconducting magnetic coils 120.

Referring to FIG. 6, a schematic electrical diagram of an embodiment of a superconducting magnetic circuit 245 is depicted. The superconducting magnetic circuit 245 includes a set of power leads 249, 251, the set of main superconducting magnetic coils 120, the set of auxiliary superconducting magnetic coils 140, 150, a superconducting main switch 255, a first heater 260, a second heater 275, a third heater 280, and an auxiliary superconducting switch 285. Current is directed through or around the set of auxiliary superconducting magnetic coils 140, 150 via the auxiliary superconducting switch 285, the second heater 275, and the third heater 280 as described below.

Current is introduced to the superconducting circuit 245 via the set of power leads 249, 251. At the start of a cycle, the first heater 260 is energized and directed to the superconducting main switch 255. In response to this heat, an electrical resistance is created within the superconducting main switch 255 that results in a conduction path 247, including power lead 249, main superconducting magnet coils 120, either auxiliary superconducting switch 285 or auxiliary superconducting magnetic coils 140, 150, (depending on the state of the second heater 275 and the third heater 280 and described further below) and power lead 250. In response to an appropriate level of current flow through the conduction path 247, the first heater 260 is de-energized, which causes the resistance of the superconducting main switch 255 to become zero, thereby creating a closed circuit across the superconducting main switch 255, and allowing current flow persistently through the circuit 245 to become self-sustaining in a superconducting manner. In response to the self-sustaining condition of current flow through the circuit 245, the power leads 249, 251 may be removed or simply disconnected.

Referring still to FIG. 6, if the cryogenic magnet assembly 15 of version three is to provide the extended field of view 310, the second heater 275 is de-energized and the third heater 280 is energized, creating an electrical resistance within the auxiliary superconducting switch 285. The electrical resistance within the auxiliary superconducting switch 285 causes current to be directed through the auxiliary superconducting magnetic coils 140, 150, which have substantially zero resistance in the 4K helium environment. Alternatively, if the cryogenic magnet assembly 15 is configured to provide the original field of view 300, the second heater 275 will be energized and the third heater 280 will be de-energized. This arrangement provides an electrical resistance in the auxiliary superconducting magnetic coils 140, 150, and substantially zero electrical resistance through the auxiliary superconducting switch 285, thereby directing current through the auxiliary superconducting switch 285, effectively bypassing the auxiliary superconducting magnetic coils 140, 150. While an embodiment of version three has been described employing the set of heaters 260, 275, 280 and superconducting switches 255, 285 to divert current, it will be appreciated that the scope of the invention is not so limited, and that the invention also applies to MRI systems 10 using alternate means known in the art for switching superconducting coil configurations.

While embodiments of the invention have been described employing three sets of room temperature steel rings 170, 180, 190 disposed within the gradient coil module 11, it will be appreciated that the scope of the invention is not so limited, and that the invention also applies to MRI systems 10 having other numbers of room temperature steel rings 170, 180, 190, for example one, two, or four sets of rings that may be disposed elsewhere radially inboard of the cryogenic magnet assembly 15, for example, between the cryogenic magnet assembly 15 and the gradient coil module 11, or between the gradient coil module 11 and the RF coils 16, 17. These rings 170, 180, 190 may also utilize alternate ring constructions, for example, rings with circumferential segments 193, axial gaps 192, radial gaps 191, or laminations thereof may also be employed to reduce eddy currents and provide fine shimming of the magnetic field.

Additionally, although some embodiments have been described that provide the option to employ the extended field of view 310, there may be situations where the extended field of view is not desired. For example, some applications may be well suited to the original field of view 300. Further, the gradient coil module 11 without rings 170, 180, 190 may allow a larger bore 13.

Figure 7:
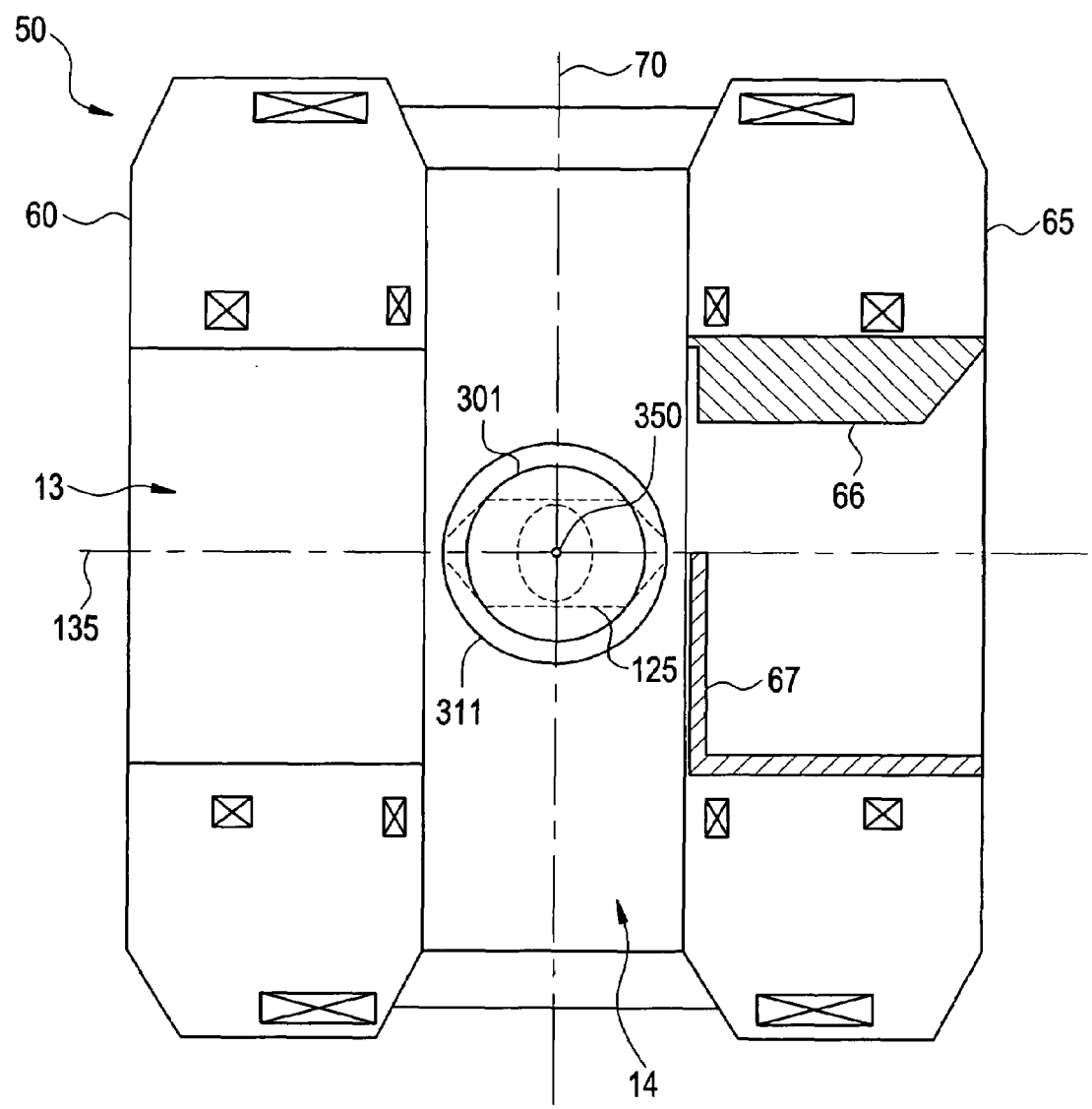
FIG. 7 depicts an exemplary open MRI system for use in accordance with embodiments of the invention.

Referring to FIG. 7, a cross sectional view of an open MRI system (also herein referred to as a double-donut arrangement) 50 is depicted, including two parallel annular magnet housings 60, 65, gradient coil modules 66, 67, a first interventional access space 14, a bore (also herein referred to as a second interventional access space) 13, an axis 70, a central z-axis 135, a standard field of view (also herein referred to as a first field of view, or uniformity volume) 301, an extended field of view (also herein referred to as a second field of view, or uniformity volume) 311, and an isocenter 350.

The center of the annular magnet housings 60, 65 define the z-axis 135 and house superconducting magnetic coils (similar to main superconducting magnetic coils 120 discussed previously) as well as superconducting compensation coils (similar to the superconducting coils 130, 140, 150 discussed previously). The separation between the annular magnet housings 60, 65 defines the first interventional access space 14, the center of which defines the axis 70. The intersection of the axis 70 and the z-axis 135 define the isocenter 350 upon which the fields of view 301, 311 are centered.

Note that for clarity, no gradient coil module 66, 67 is depicted in the annular magnet housing 60, and that the gradient coil modules 66, 67 represent two different configurations, depicted together in FIG. 7 for convenience. Each gradient coil module 66, 67 is symmetric around the z-axis 135, and in an embodiment, one configuration of the gradient coil module 66, 67 would be disposed within each of the annular magnet housings 60, 65. The centers of the gradient coil modules 66, 67 define the bore 13 along the central z-axis 135. A first set of room temperature steel rings (similar to the rings 170, 180, 190 discussed previously) is disposed within each gradient coil module 66, and a second set of room temperature steel rings (similar to the rings 170, 180, 190 discussed previously) is disposed within each gradient coil module 67.

The bore 13 may provide a second interventional access space along the central z-axis 135 as discussed above, which may vary with different MRI system configurations and applications. For some open MRI system 50 configurations, a large bore 13 opening may be desired to allow interventional procedures and access to the imaging object 125 along both of the axes 70, 135. Other MRI applications, such as diagnostic procedures for example, may require the extended field of view 311, but not physical access to the imaging object 125.

As described above for the cylindrical magnet MRI embodiments, room temperature steel rings (similar to the rings 170, 180, 190 discussed previously), may be configured in conjunction with superconducting compensation coils (similar to the superconducting coils 130, 140, 150 discussed previously) to compensate for magnetic field harmonic terms, thereby defining the uniformity volumes 301, 311.

In an embodiment, it may be preferred to have one MRI system 50, which is capable of providing a first field of view 301 and a second field of view 311, as required by the application. If the embodiment is to be configured to allow interventional procedures, the gradient coil modules 66 may be disposed within the annular magnet housings 60, 65, and a first level of current will be directed to through superconducting compensation coils (similar to superconducting coils 130, 140, 150 discussed previously) to provide interventional access to the imaging object 125 along two axes 70, 135. In this arrangement, a homogeneity limit of +/−5 ppm for the 30 cm uniformity volume 301 may be obtained. Alternatively, if the embodiment is to be configured to allow diagnostic procedures, the gradient coil modules 67 may be disposed within the annular magnet housings 60, 65 to provide the extended field of view 311, and limited interventional access to the imaging object 125 along only one axis (the z-axis 135). For this application, the gradient coil modules 67, in conjunction with a second, different level of current directed through the superconducting compensation coils (similar to superconducting coils 130, 140, 150 discussed previously) may yield a homogeneity of +/−5 ppm for the 40 cm uniformity volume 311.

As disclosed, some embodiments of the invention may include some of the following advantages: the ability to extend the axial field of view for a given superconducting magnet design; the ability to provide multiple axial fields of view with a single superconducting magnet coil design; the ability to separate harmonic compensation effects between room temperature steel rings and superconducting compensation coils; the ability to utilize an open MRI for either interventional or diagnostic procedures; and, the ability to enhance dampening of vibration and acoustic energy.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Accordingly, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. Do not denote any order or importance, but rather the terms first, second, etc. Are used to distinguish one element from another. Furthermore, the use of the terms a, an, etc. do not denote a limitation of quantity, but rather denote the presence of at least one of the referenced item.

What is claimed is:

1. A Magnetic Resonance Imaging (MRI) system, comprising:
a cryogenic magnet assembly comprising a cryogenic vessel and a superconducting magnet disposed within the vessel;
a gradient coil module disposed radially inboard of the cryogenic magnet assembly; and
a plurality of room temperature steel rings proximate to the gradient coil module and disposed radially inboard of the cryogenic magnet assembly;
wherein at least the superconducting magnet, the gradient coil module, and the plurality of room temperature steel rings define a field of view (FOV);
wherein in response to the superconducting magnet being energized, the plurality of room temperature steel rings create high order harmonics that serve to expand the magnetic field homogeneity FOV, and low order harmonics that tend to degrade the magnetic field homogeneity within the FOV; and
wherein the low order harmonics are compensated for by the cryogenic magnet assembly.

2. The MRI system of claim 1 wherein:
the plurality of room temperature steel rings are configured to create the high order harmonics having an order greater than or equal to a defined value n0.

3. The MRI system of claim 2, wherein:
the degrading low order harmonics have an order less than the defined value n0; and
the cryogenic magnet assembly is configured to compensate for the degrading low order harmonics.

4. The MRI system of claim 3, wherein:
the defined value n0 equals 6.

5. The MRI system of claim 2, wherein:
the plurality of room temperature steel rings are configured to create high order harmonics having two consecutive, even high order terms.

6. The MRI system of claim 1, wherein:
the plurality of room temperature steel rings comprises circumferential segments of steel; and
the plurality of room temperature steel rings are axially disposed and comprises axial gaps between the axially disposed rings.

7. The MRI system of claim 1, wherein:
the plurality of room temperature steel rings are radially disposed and comprises radial gaps between the radially disposed rings.

8. The MRI system of claim 1, wherein:
the plurality of room temperature steel rings comprises laminations.

9. The MRI system of claim 1, wherein:
the plurality of room temperature steel rings are configured to reduce vibration and acoustic energy within the gradient coil module.

10. The MRI system of claim 8, further comprising:
a potting compound disposed within the gradient coil module and about the plurality of room temperature steel rings.

11. The MRI system of claim 9, wherein:
the plurality of room temperature steel rings are fixedly secured within the gradient coil module.

12. The MRI system of claim 1, wherein:
the superconducting magnet is configured to compensate for the degrading low order harmonics.

13. The MRI system of claim 1, wherein:
the superconducting magnet is configured to provide a first field of view having a defined homogeneity in the absence of the room temperature steel rings;
the superconducting magnet and the room temperature steel rings are configured to provide a second field of view having about the same homogeneity as the first field of view; and
an axial dimension measured along the z-axis of the second field of view is greater than the axial dimension of the first field of view.

14. The MRI system of claim 1, further comprising:
a set of superconducting compensation coils disposed within the cryogenic vessel, the compensation coils configured to compensate for the degrading low order harmonics.

15. The MRI system of claim 14, wherein:
the set of superconducting compensation coils define shim coils that are separate and independent of the superconducting magnet.

16. The MRI system of claim 14, wherein:
the set of superconducting compensation coils define auxiliary coils that are an extension of the coils of the superconducting magnet.

17. The MRI system of claim 14, wherein:
the cryogenic magnet assembly is configured to be a double-donut arrangement that allows for interventional access from at least one axis;
the superconducting magnet and the plurality of room temperature steel rings are capable of providing a first field of view and a second field of view; and
the superconductor compensation coils are capable of receiving a first level of current and a second different level of current.

18. The MRI system of claim 17, wherein:
the plurality of room temperature steel rings comprise a first set of room temperature steel rings;
the superconducting magnet and the first set of room temperature steel rings are configured to provide the first field of view having a defined homogeneity;
the interventional access is allowed from two axes; and
the superconductor compensation coils are responsive to the first level of current.

19. The MRI system of claim 17, wherein:
the plurality of room temperature steel rings comprise a second set of room temperature steel rings;

the superconducting magnet and the second set of room temperature steel rings are configured to provide the second field of view having about the same homogeneity as the first field of view;

the axial dimension of the second field of view is greater than the axial dimension of the first field of view;

the interventional access is allowed from only one axis; and the superconductor compensation coils are responsive to the second level of current.

20. The MRI system of claim 19, wherein:

a uniformity volume of the second field of view is greater than the uniformity volume of the first field of view.

21. The MRI system of claim 1, wherein:

the superconducting magnet is configured to provide a first field of view having a defined homogeneity in the absence of the room temperature steel rings;

the superconducting magnet and the room temperature steel rings are configured to provide a second field of view having about the same homogeneity as the first field of view; and only a radial dimension of the second fiedl of view is greater than the respective radial dimension of the first field of view.

* * * * *